US005689685A

United States Patent [19]

Feldmann et al.

[11] Patent Number: 5,689,685

[45] Date of Patent: Nov. 18, 1997

[54] APPARATUS AND METHOD FOR ANALYZING CIRCUITS USING REDUCED-ORDER MODELING OF LARGE LINEAR SUBCIRCUITS

[75] Inventors: Peter Feldmann, Short Hills; Roland Wilhelm Freund, New Providence, both of N.J.

[73] Assignee: Lucent Technologies Inc., Murray Hill, N.J.

[21] Appl. No.: 489,270

[22] Filed: Jun. 9, 1995

Related U.S. Application Data

[63] Continuation-in-part of Ser. No. 269,230, Jun. 30, 1994, Pat. No. 5,537,329.

[51] Int. Cl.$^6$ .................................................... G06G 7/19
[52] U.S. Cl. ........................... 395/500; 364/488; 364/489; 364/578
[58] Field of Search .......................... 395/500; 364/488, 364/489, 490, 491, 578, 900; 341/156; 128/700

[56] References Cited

U.S. PATENT DOCUMENTS

| | | | |
|---|---|---|---|
| 3,591,784 | 7/1971 | Cutter et al. | 235/152 |
| 3,601,592 | 8/1971 | Cutter et al. | 235/156 |
| 3,918,395 | 11/1975 | Fearnside | 118/8 |
| 4,101,383 | 7/1978 | Wyatt et al. | 195/103.5 R |
| 4,264,566 | 4/1981 | Giles et al. | 423/359 |
| 4,280,388 | 7/1981 | White | 84/1.24 |
| 4,593,378 | 6/1986 | McWhirter et al. | 364/900 |
| 4,665,523 | 5/1987 | Citron et al. | 371/37 |
| 4,755,761 | 7/1988 | Ray, Jr. | 329/50 |
| 4,774,667 | 9/1988 | Kuraoka et al. | 364/426.02 |
| 4,792,787 | 12/1988 | Speiser et al. | 341/156 |
| 4,848,851 | 7/1989 | Kuraoka et al. | 303/100 |
| 4,853,861 | 8/1989 | Ford et al. | 364/424.06 |
| 4,951,264 | 8/1990 | Yamamoto | 367/15 |
| 4,991,093 | 2/1991 | Roberge et al. | 364/413.15 |
| 5,018,086 | 5/1991 | Agarwal | 364/557 |
| 5,047,969 | 9/1991 | Sloane | 364/578 |
| 5,094,127 | 3/1992 | Ishida et al. | 74/866 |
| 5,164,727 | 11/1992 | Zakhor et al. | 341/143 |
| 5,276,629 | 1/1994 | Reynolds | 364/487 |
| 5,278,770 | 1/1994 | Gore et al. | 364/490 |
| 5,282,148 | 1/1994 | Poirot et al. | 364/491 |
| 5,282,213 | 1/1994 | Leigh et al. | 371/22.1 |
| 5,349,541 | 9/1994 | Alexandro, Jr. et al. | 364/578 |
| 5,377,687 | 1/1995 | Evans et al. | 128/700 |
| 5,537,329 | 7/1996 | Feldmann et al. | 364/489 |

OTHER PUBLICATIONS

"Small-Signal Circuit Analysis and Sensitivity Computations with the PVL Algorithm", by R. Freund and P. Feldmann, IEEE Transactions on Circuits and Systems—II: Analog nd Digital Signal Processing, vol. 43, No. 8, Aug. 1996, pp. 577–585.

"Efficient Linear Circuit Analysis by Pade Approximation via the Lanczos Process", by P. Feldmann and R. Freund, IEEE Transactions on Computer–Aided Design of Integrated Circuits and Systems, vol. 14, No. 5, May 1995, pp. 639–649.

"The Generalized Eigenproblem:Pole–Zero Computation", by Stephen Haley, Proceedings of the IEEE, vol. 76, No. 2, Feb. 1988, pp. 103–120.

(List continued on next page.)

*Primary Examiner*—Kevin J. Teska
*Assistant Examiner*—Russell W. Frejd

[57] ABSTRACT

A circuit analyzer and method are disclosed for generating and outputting a Matrix Padé via Lanczos (MPVL) approximation of a frequency response of a circuit from input circuit parameters. A processing unit has a memory for storing circuit characteristic data representing a circuit; a program for generating matrix transfer function data relating to a matrix transfer function associated with the circuit characteristic data; a processor for executing the program; and the processing unit generates the frequency response signal in response to the matrix transfer function data.

22 Claims, 5 Drawing Sheets

OTHER PUBLICATIONS

"Dominant Pole(s)/Zero(s) Analysis for Analog Circuit Design*", by Lawrence Pillage et al., IEEE 1989 Custom Integrated Circuits Conference, 1989 IEEE pp. 21.3.1–21.3.4.

"Fast Simulation of Reflection and Crosstalk Effects using a Pade Approximation", by E.Griese et al., Electromagnetic Compatibility, 5–7 Sep., Conference Publication No. 396, IEE, pp. 209–216.

G.A. Baker, Jr. and P. Graves–Morris, Padé Approximants, Part I: Basic Theory, Addison–Wesley, Reading, MA, pp. 1–43, 1981.

E. Chiprout and M.S. Nakhla, Asymptotic Waveform Evaluation and Moment Matching for Interconnect Analysis, Kluwer Academic Publishers, Norwell, MA, 1994.

J.Vlach and K. Singhal, Computer Methods for Circuit Analysis and Design, Van Nostrand Reinhold, New York, N.Y., pp. 1001–1041, 1983.

Matlab User's Guide, The MathWorks, Inc., Natick, MA, pp. (i) to (iv) and pp. 1–1 to 1–3, 1992.

M.M. Alaybeyi, J.Y. Lee, and R.A. Rohrer, "Numerical Integratioin Algorithms nad Asymptotic Waveform Evaluation (AWE),", Technical Digest of the 1992 IEEE/ACM International Conf. on Computer–Aided Design, pp. 76–79, Nov., 1991.

E. Chiprout and M. Nakhla, "Generalized Moment–Matching Methods for Transient Analysis of Interconnect Networks", Proc. of the 29th ACM/IEEE Design Automation Conf., pp. 201–206, Jun., 1992.

R.W. Freund,"The Look–Ahead Lanczos Process for Large Nonsymmetric Matrices and Related Algorithms", Linear Algebra for Large Scale and Real–Time Applications, Kluwer Academic Publishers, Dordecht, The Netherlands, pp. 137–163, 1993.

R.W. Freund, M.H. Gutknecht, and N.M. Nachtigal, "An Implementation of the Look–Ahead Lanczos Algorithm for Non–Hermitiant Matrices", Siam J. Sci. Comput., vol. 14, No. 1, pp. 137–158, 1993.

W.B. Gragg, "Matrix Interpretations and Applications of the Continued Fraction Algorithm", Rocky Mountain J. Math., vol. 4, No. 2, pp. 213–225, 1974.

H. Heeb, A.E. Ruehli, J.E. Bracken, and R.A. Rohrer, "Three Dimensional circuit Oriented Electromagnetic Modeling for VLSI Interconnects", Proc. of the 1992 IEEE International Conf. on Computer Design: VLSI in Computers & Processors, pp. 218–221, Oct. 1992.

X. Huang, Padé Approximation of Linear(ized) Circuit Responses, Ph.D. Dissertation, Department of Electrical and Computer Engineering, Carnegie Mellon University, Pittsburgh, PA< Nov., 1990.

W. Kahan, B.N. Partlett, and E. Jiang,"Residual bounds on Approximate Eigensystems of Nonnormal Matrices", Siam J. Numer. Anal., vol. 19, No. 3, pp. 470–484, 1982.

C. Lanczos, "An Iteration Method for the Solution of the Eigenvalue Problem of Linear Differential and Integral Operators" J. Res. Nat. Bur. Standards, vol. 45, No. 4, pp. 255–282, 1950.

L.T. Pillage and R.A. Rohrer, "Asymptotic Waveform Evaluation for Timing Analysis", IEEE Trans. Computer–aided Design, vol. CAD–9, No. 4, pp. 352–366, Apr., 1990.

V. Raghavan, J.E. Bracken, and R.A. Rohrer, "AWESpice: A General Tool for the Accurate and Efficient Simulation of Interconnect Problems", Proc. of the 29th ACM/IEEE Design Automation Conf., App. 87–92, Jun., 1992.

V. Raghaven, R.A. Rohrer, L.T. Pillage, J.Y. Lee, J.E. Bracken, and M.M. Alaybeyi, "AWE–Inspired", Proc. of the IEEE 1993 Custom Integrated Circuits Conf., pp. 18.1.1 to 18.1.8, May, 1993.

A.E. Ruehli, "Equivalent Circuit Models for Three–Dimensional Multiconductor Systems", IEEE Trans. Microwave Theory and Tech., vol. MTT–22, No. 3, pp. 216–221, Mar., 1974.

T.J. Schmerbeck, R.A. Richetta, and L.D. Smith, "A 27MHz Mixed Analog/Digital Magnetic Recording Channel DSP Using Partial Response Signalling with Maximum Likelihood Detection", Technical Digest of the 1991 IEEE International Solid–State Circuit Conf., pp. 136–137, Feb., 1991.

B.R. Stanisic, R.A. Rutenbar, and L.R. Carley, "Mixed–Signal Noise–Decoupling via Simultaneous Power Distribution Design and Cell Customization in Rail", Proc. of the 1994 IEEE Custom Integrated Circuits Conf., 1994.

APPARATUS AND METHOD FOR ANALYZING CIRCUITS USING REDUCED-ORDER MODELING OF LARGE LINEAR SUBSCIRCUITS

CROSS REFERENCE TO RELATED APPLICATIONS

This application is a continuation-in-part of application Ser. No. 08/269,230, filed Jun. 30, 1994 now U.S. Pat. No. 5,537,329.

BACKGROUND

1. Technical Field

This disclosure relates analyzers for electrical circuits. In particular, this disclosure relates to an apparatus and method for analyzing linear and linearized circuits and networks to approximate a matrix transfer function using reduced-order modeling via a block Lanczos procedure.

2. Description of the Related Art

Electric and electronic circuits may have relatively large linear subnetworks, such as large interconnected networks that are extracted from a integrated circuit layout, or when a circuit includes models of distributed elements such as transmission lines, ground planes, or three-dimensional structures. The analysis of such circuits may be performed by replacing linear subnetworks in a circuit with a reduced-order model that substantially approximates the external behavior of the linear subnetwork. Efficient analysis techniques may then utilize the linear aspect of the subnetworks, thus reducing the complexity of the analysis to be performed by non-linear analysis techniques.

Analysis of these large linear subnetworks having multiple-inputs and multiple-outputs may be computationally cumbersome because the transfer functions from each input to each output is required to be analyzed.

SUMMARY

It is preferable to analyze large linear circuits or networks modelled by matrices using a numerically stable method to determine a matrix Padé approximation of the frequency response with little numerical degradation, as well as to provide an acceptable computational cost per order of approximation. A circuit analyzer and method are disclosed for generating a frequency response signal of a circuit. The circuit analyzer operating the method includes a processing unit having a memory for storing circuit characteristic data representing a circuit; a program for generating matrix transfer function data relating to a matrix transfer function associated with the circuit characteristic data; a processor for executing the program; and means for generating the frequency response signal in response to the matrix transfer function data.

BRIEF DESCRIPTION OF THE DRAWINGS

The features of the disclosed circuit analyzer and method will become more readily apparent and may be better understood by referring to the following detailed description of an illustrative embodiment of the present invention, taken in conjunction with the accompanying drawings, where.

DESCRIPTION OF THE PREFERRED EMBODIMENTS

Figure 1:
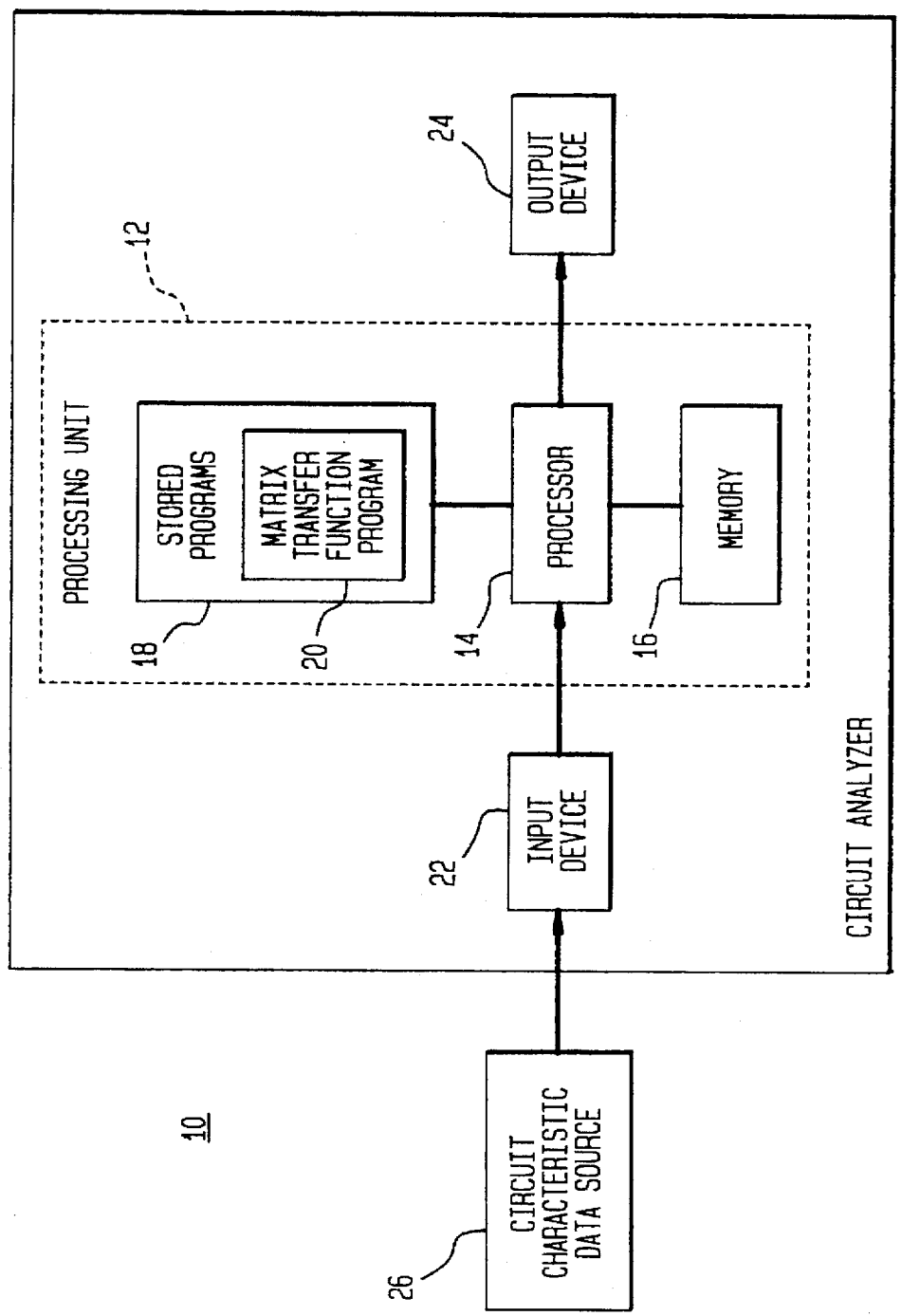
FIG. 1 illustrates a block diagram of the components of the circuit analyzer disclosed herein.

Referring now in specific detail to the drawings, with like reference numerals identifying similar or identical elements, as shown in FIG. 1, the present disclosure describes an apparatus and method implementing a circuit analyzer 10, which includes a processing unit 12 having a processor 14, memory 16, and stored programs 18 including a matrix transfer function program 20; an input device 22; and an output device 24.

In commonly assigned U.S. patent application Ser. No. 08/269,230, filed Jun. 30, 1994, and entitled "APPARATUS AND METHOD FOR ANALYZING CIRCUITS", which is incorporated herein by reference, a Padé via Lanczos method is disclosed for determining a scalar Padé approximant of a transfer function of a circuit for use in determining, with substantial accuracy, the frequency response behavior of the circuit. The matrix transfer function program 20 performs a generalized matrix Padé via Lanczos method, as described herein below, which generalizes the Padé via Lanczos method disclosed in U.S. patent application Ser. No. 08/269,230 to systems of equations determining the frequency response behavior of a circuit under analysis. It is to be understood that the Padé via Lanczos method disclosed in U.S. patent application Ser. No. 08/269, 230 may be applied as well to systems of equations determining the frequency response behavior of a circuit under analysis.

In an exemplary embodiment, the processing unit 12 is preferably a SPARC workstation available from SUN MICROSYSTEMS, INC. having about 32 MB associated RAM memory and a hard or fixed drive as memory 16. The processor 14 operates using the UNIX operating system to run application software as the stored programs 18 providing programs and subroutines implementing the disclosed circuit analyzer 10 and method.

The processor 14 receives commands and circuit characteristic data from a circuit characteristic data source 26 through the input device 22 which includes a keyboard and/or a data reading device such as a disk drive for receiving the circuit characteristic data from storage media such as a floppy disk. The received circuit characteristic data may be stored in memory 16 for further processing to generate a frequency response signal of the circuit under analysis over a range of frequencies representing the approximated or predicted frequency response of the circuit. The generated frequency response signal of a linear macroblock or subcircuit may be a subgoal in the non-linear analysis of a circuit.

The generated frequency response signal may be used by the processor 14 to generate a graphic representation for plotting the approximated frequency response in volts, amps, or other scales versus a range of frequencies. The graphic representation is sent to an output device 24 such as a display for displaying the predicted frequency response of the circuit under analysis. Alternatively, the output device 24 may include specialized graphics programs to convert the generated frequency response signal to a displayed graphic. In additional embodiments, the generated frequency response signal may include determined poles, zeros, and/or residues listed in a file for output as columns or tables of text by the output device 24 which may be a display or a hard copy printer.

Figure 2:
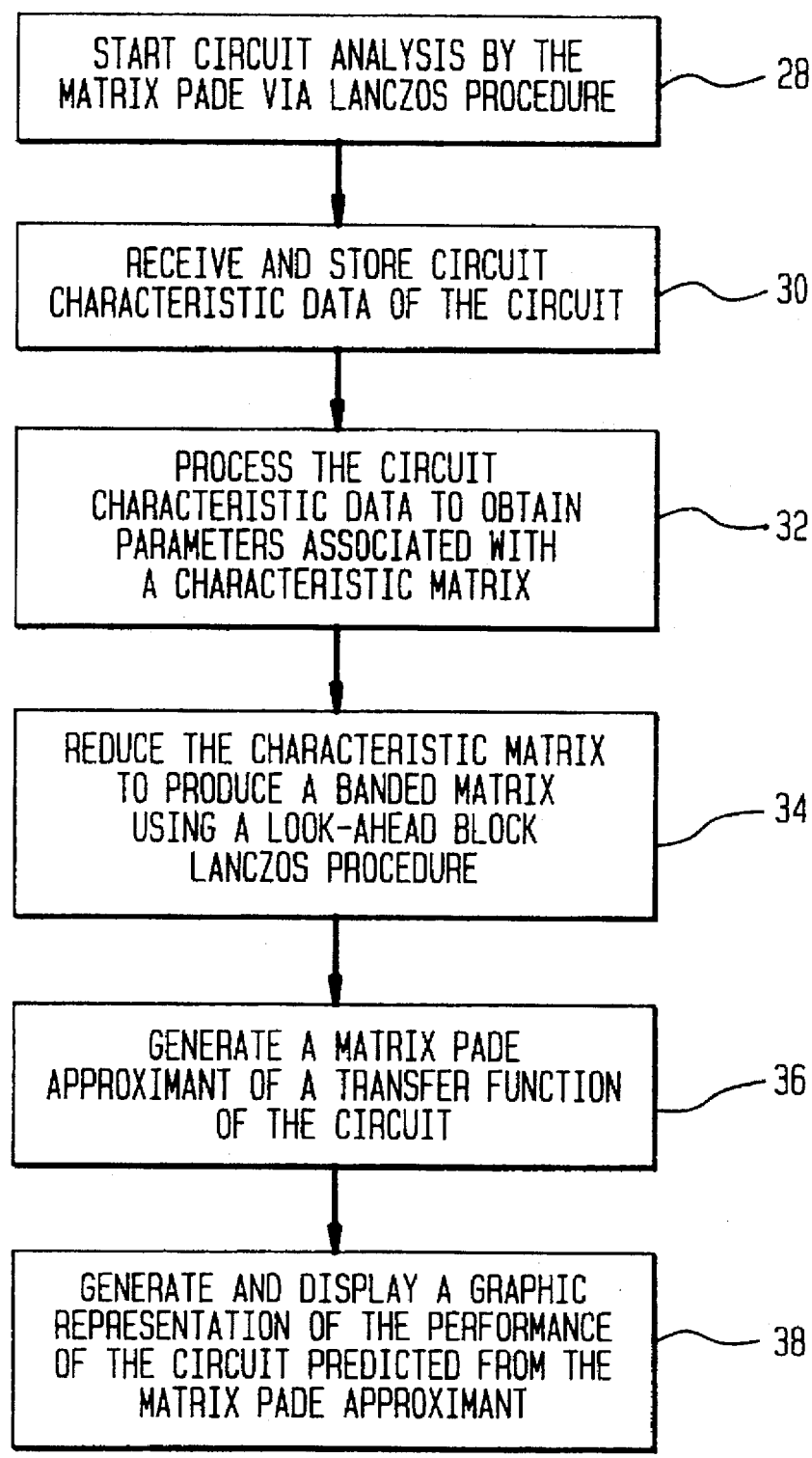
FIG. 2 illustrates a flowchart of the operation of the circuit analyzer to implement a Matrix Padé via Lanczos (MPVL) approximation of a frequency response.

The circuit analyzer 10 performs the application programs and subroutines, described hereinbelow in conjunction with FIGS. 2–3, which are implemented from compiled source code in the C++ and/or the FORTRAN programming languages.

The circuit analyzer 10 also includes a method for generating a frequency response signal of a circuit, including the steps of starting the circuit analysis by the MPVL procedure in step 28; receiving and storing the circuit characteristic data of the circuit in step 30; processing the circuit characteristic data in step 32 to obtain parameters associated with a characteristic matrix A; reducing the characteristic matrix A using the matrix transfer function program 20 of the stored programs 18 in step 34 to produce the banded matrix $T_k$ using the look-ahead block Lanczos procedure; generating a matrix Padé approximant of a transfer function of the circuit in step 36; and generating and displaying a graphic representation of the performance of the circuit in step 38 as predicted from the matrix Padé approximant.

Figure 3:
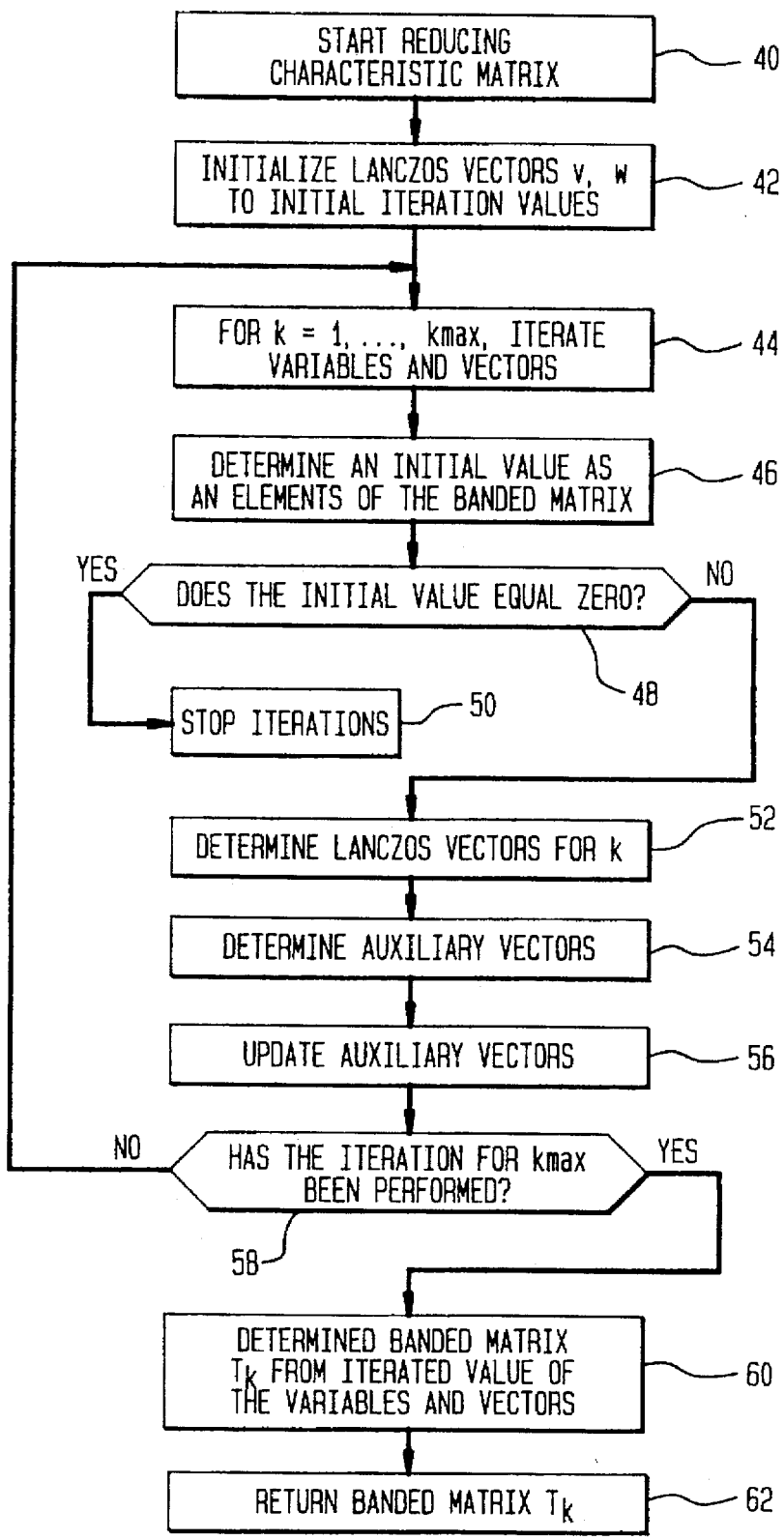
FIG. 3 illustrates a flowchart of a subroutine implementing a look-ahead Lanczos procedure.

As shown in FIG. 3, the step 34 in FIG. 2 for reducing the characteristic matrix A includes a subroutine performing the steps of starting the reduction of the characteristic matrix A in step 40; initializing Lanczos vectors v, w to initial iteration values in step 42; iterating the variables and vectors in step 44 as described below for values of iteration variable k from 1 to $k_{max}$; determining at least an initial value $t_{k,k-m}$ as an element of the banded matrix $T_k$ in step 46, and testing in step 48 if the initial value $t_{k,k-m}$ is substantially near zero. If so, the iterations stop in step 50; otherwise, the iterations continue in step 52–58.

The method determines the Lanczos vectors for iteration k in step 52, determines auxiliary vectors in step 54, updates the auxiliary vectors in step 56, and determines if the iteration for $k_{max}$, i.e. the last iteration, has been performed in step 58. If the iterations are not complete, the method loops back to continue the iterations for the next value of k to perform steps 44–58 until the iterations are complete. When the iterations are complete, the method then determines the banded matrix $T_k$ in step 60 from the iterated values of the variable and vectors; and the method then returns the banded matrix $T_k$ in step 62 to the procedure in FIG. 2 to proceed to steps 36–38 to determine the frequency response of the circuit.

Referring back to FIG. 2, the generated banded matrix $T_k$ in step 34 is used to determine a matrix Padé approximant of the frequency response of the circuit in step 36 in a manner comparable to the method as described in U.S. application Ser. No. 08/269,230, incorporated above by reference. For example, eigenvalues and eigenvectors of $T_k$ may be generated to determine the poles and residues of the frequency response of the circuit, and $T_k$ may be used to calculate the zeros of the frequency response of the circuit.

Using any circuit-equation formulation technique, such as modified nodal analysis or sparse tableau, a circuit may be described by a system of first order differential equations:

$$\frac{d}{dt} \hat{q}(z,t) + \hat{f}(z,t) = 0 \tag{1}$$

with z=z(t) as the vector of circuit variables at time t, with the term $\hat{f}(z,t)$ representing the contribution of non-reactive elements such as resistors, sources, etc., and the term d/dt $\hat{q}(z,t)$ representing the contribution of reactive elements such as capacitors and inductors.

For a circuit separable into a linear subnetwork and a remainder of the circuit, let $$z = \begin{bmatrix} x_N \\ y \\ x_L \end{bmatrix} \tag{2}$$

where $x_L$ denotes variables exclusive to the linear subnetwork, $x_N$ are variables exclusive to the remainder of the circuit, and y represents variables shared by the linear subnetwork and the remainder. Using Equation (2) as a partitioning of the circuit into linear and non-linear subnetworks, Equation (1) may be rewritten as:

$$\frac{d}{dt} \left( \left[ \begin{matrix} q\left( \begin{bmatrix} x_N \\ y \end{bmatrix}, t \right) \\ 0 \end{matrix} \right] + \begin{bmatrix} 0 \\ C \end{bmatrix} \cdot \begin{bmatrix} y \\ x_L \end{bmatrix} \right) + \left[ \begin{matrix} f\left( \begin{bmatrix} x_N \\ y \end{bmatrix}, t \right) \\ 0 \end{matrix} \right] + \begin{bmatrix} 0 \\ G \end{bmatrix} \cdot \begin{bmatrix} y \\ x_L \end{bmatrix} = 0 \tag{3}$$

In Equation (3), the vector-valued functions q and f represent the contributions of resistive and reactive elements from the non-linear partitions of the circuit, and the matrices C and G represent, respectively the contributions of resistive and reactive elements of the linear partition. Referring to Equation (3), the vectors q and f may be scaled to have the same length, and the matrices C and G may be square matrices of the same size. Such scaling of parameters q, f, C and G may be performed by padding each of q, f, C and G with additional zeros.

The system of equations in Equation (3) may be solved using non-linear ordinary differential equation solvers, such as SPICE-like simulators. However, when the cardinality of $x_L$ is large, substantial computational savings may be attained by replacing the linear subnetwork with a reduced-order model which may exhibit substantially the same behavior at the interface of the linear subnetwork with the remainder of the circuit.

The equations referring to the linear subnetwork in Equation (3) may be separated by introducing an m-vector; i.e. a vector of length m, of circuit variables u=u(t), which represents interface signals to the remainder of the circuit being analyzed.

Equation (3) may be transformed to a coupled system of equations:

$$\frac{d}{dt} q\left( \begin{bmatrix} x_N \\ y \end{bmatrix}, t \right) + f\left( \begin{bmatrix} x_N \\ y \end{bmatrix}, t \right) + \begin{bmatrix} 0 \\ I_m \end{bmatrix} u = 0 \tag{4}$$

$$C \frac{d}{dt} \begin{bmatrix} y \\ x_L \end{bmatrix} + G \begin{bmatrix} y \\ x_L \end{bmatrix} = \begin{bmatrix} I_m \\ 0 \end{bmatrix} u$$

where $I_m$ is the m×m identity matrix.

In a nodal formulation of the circuit, the variables y and u represent the voltages and currents, respectively, in the wires or connections of the circuit that the connect the linear and non-linear partitions of the circuit. Set $$x = \begin{bmatrix} y \\ x_L \end{bmatrix}, B = \begin{bmatrix} I_m \\ 0 \end{bmatrix}, \text{ and } L = \begin{bmatrix} I_p \\ 0 \end{bmatrix} \tag{5}$$

where L is a matrix which selects the y subvector from x, and p is the length of the vector y. $L^T$ is a matrix that selects the y subvector from x; i.e. $y = L^T x$. The multiple-input, multiple-output linear subnetwork may be described by:

$$C \frac{d}{dt} x + Gx = Bu \qquad (6)$$

$$y = L^T x$$

Equation (6) describes an m input, p output linear network which may be analyzed in terms of its p×m matrix of Laplace-domain transfer functions, obtained as described below. Applying the Laplace transform to Equation (6) results in:

$$sCX + GX = BU$$

$$Y = L^T X \qquad (7)$$

where X, U and Y denote the Laplace transform of x, u and y, respectively.

Let $s_0 \in C$ be an arbitrary but fixed frequency shift or expansion point such that the matrix $G + s_0 C$ is non-singular, and using the change of variables $s = s_0 + \sigma$, set $$A := -(G + s_0 C)^{-1} C$$

$$R := (G + s_0 C)^{-1} B. \qquad (8)$$

where parameters G and C are thus associated with the characteristic matrix A. Hereinafter, the notation ":=" indicates assignment, definition, or setting a variable accordingly, and $(\ )^{-1}$ indicates the inverse operator for scalars and matrices, accordingly.

Matrix A is hereinafter called the characteristic matrix or circuit characteristic matrix of the circuit, determined from the circuit matrices G and C of the characteristics of the circuit or network.

The matrix Y may then be obtained from Equation (7) by:

$$Y = L^T (I - \sigma A)^{-1} RU \qquad (9)$$

and a transfer function matrix H(s) may be obtained as:

$$H(s) = H(s_0 + \sigma) = Y(\sigma) U^{-1}(\sigma) = L^T (I - \sigma A)^{-1} R \qquad (10)$$

where I is the identity matrix.

To determine the matrix-valued transfer function $H(\sigma)$ by approximation with a reduced-order model with substantial accuracy, a Lanczos process is employed by the disclosed circuit analyzer 10 and method which produces a relatively small-dimensional approximation, denoted by matrix $T_k$, to the matrix A, which may be a relatively large-dimensional matrix. The matrix $T_k$ may be a best k×k approximation to A, where the approximation may be substantially accurate even if k is very small compared to the order N of the N×N matrix A. Generally, k<<N.

With $e_1$ as a first unity vector, $$H_k(\sigma) = L^T R e^T_1 (I - T_k \sigma)^{-1} e_1 \qquad (11)$$

may represent the $k^{TH}$ order Padé approximation of the transfer function $H(\sigma)$, as described in U.S. application Ser. No. 08/269,230, incorporated above by reference. The approximation is generally of substantial accuracy in a relatively large domain of the complex plane surrounding the expansion point $s_0$ to include all frequencies of interest. The Padé approximation represented by matrix $T_k$ may be used to determine the poles, zeroes, and residues of a linear system, and the matrix $T_k$ and other variables such as the Lanczos vectors $v_i$ and $w_i$ have properties as described in U.S. application Ser. No. 08/269,230, incorporated above by reference. As discussed in R. W. Freund et al., "Efficient Small-Signal Circuit Analysis and Sensitivity Computations With the PVL Algorithm", TECHNICAL DIGEST OF IEEE/ACM INTERNATIONAL CONFERENCE ON COMPUTER-AIDED DESIGN, November 1994, differentiation of the Padé approximation represented by $T_k$ may be used to determine various sensitivities of a system.

The disclosed circuit analyzer 10 and method may be employed to determine the matrix $T_k$ which may be used to determine a reduced-order model of a circuit represented by the circuit characteristic data 24. Equation (7) is applied to the time-domain system of Equation (6) to obtain:

$$-A \frac{d}{dt} x + (I + s_0 A) x = Ru \qquad (12)$$

$$y = L^T x$$

Setting $x = V_k d$, where d is a "short" column vector of size k, with k<<N, to constrain x to a k-dimensional subspace, the first equation in Equation (12) is premultiplied with matrix $W_k^T$ to obtain:

$$-W_k^T A V_k \frac{d}{dt} d + W_k^T V_k d + s_0 W_k^T A V_k \frac{d}{dt} d = W_k^T Ru \qquad (13)$$

$$y = L^T V_k d$$

From the properties of the Lanczos vectors and matrices, as described in U.S. application Ser. No. 08/269,230, incorporated above, $W_k^T A V_k = D_k T_k$. From the biorthogonality of the Lanczos vectors, $W_k^T V_k = D_k$, and $R = \rho V_k e_1$ and $L = \eta W_k e_1$ are starting Lanczos vectors with scaling factors $\rho$, $\eta > 0$ chosen such that $\|v_1\|_2 = \|w_1\|_2 = 1$. From the above, Equation (13) becomes:

$$-T_k \frac{d}{dt} d + (I + s_0 T_k) d = \rho e_1 u \qquad (14)$$

$$y = \eta e_1^T D_k d$$

Accordingly, the original system modeled by Equation (4) is approximated by a smaller system where a reduced-order model has a $k^{TH}$ order Padé approximation of the original circuit. The smaller system may be expressed as:

$$\frac{d}{dt} q\left(\begin{bmatrix} x_N \\ y \end{bmatrix}, t\right) + f\left(\begin{bmatrix} x_N \\ y \end{bmatrix}, t\right) + \begin{bmatrix} 0 \\ 1 \end{bmatrix} u = 0 \qquad (15)$$

$$-T_k \frac{d}{dt} d + (I + s_0 T_k) d = \rho e_1 u$$

$$y = \eta \delta_1 d_1$$

where $d_1$ denotes the first component of $d = [d_1\ d_2\ \ldots\ d_k]^T$.

From Equation (15), $$d = \begin{bmatrix} \frac{y}{\eta \delta_1} \\ d_{2:k} \end{bmatrix} \qquad (16)$$

where $d_{2:k} = [d_2\ d_3\ \ldots\ d_k]^T$. The interface variable u may be eliminated and the first expression in Equation (15) may be rewritten as a system of non-linear equations, using the second expression in Equation (15) as well as Equation (16), to be:

$$\frac{d}{dt} \left( \begin{bmatrix} q\left(\begin{bmatrix} x_N \\ y \end{bmatrix}, t\right) \\ 0 \end{bmatrix} - \begin{bmatrix} 0 \\ T_k \end{bmatrix} \cdot \begin{bmatrix} \frac{y}{\rho \eta \delta_1} \\ \frac{d_{2:k}}{\rho} \end{bmatrix} \right) + \qquad (17)$$

-continued $$\left[f\left(\begin{bmatrix} x_N \\ y \\ 0 \end{bmatrix}, t\right)\right] + \begin{bmatrix} 0 \\ I+s_0 T_k \end{bmatrix} \cdot \begin{bmatrix} y \\ \rho\eta\delta_1 \\ d_{2,k} \\ \rho \end{bmatrix} = 0 \quad (17)$$

which approximates the original system of Equation (3) with a substantially reduced number of state variables.

The reduced-order system of Equation (17) is compatible with the original system of Equation (3) in having substantially identical solutions by having initial conditions $x_0 = V_k d_0$. For initial conditions $x_0$ equalling zero except for the shared variable y, then $$y_0 = I^T x_0 = \eta e_1^T W_k^T V_k d_0 = \eta e_1^T D_k d_0 = \eta \delta_1 d_{01} \quad (18)$$

then the initial conditions $d_0 = [y_0/(\eta\delta_1) 0]^T$ are compatible with the initial conditions $x_0 = [y_0 0]^T$.

Generally, the linear subnetwork may be described by a p×m matrix of transfer functions. A reduced-order model of such a linear system may be constructed by applying the superposition property of linear networks and then to obtain a Padé approximation separately for each pair of inputs and outputs. The disclosed circuit analyzer 10 and method generates the matrix Padé approximation simultaneously from the entire matrix-values transfer function in a manner described below.

The disclosed circuit analyzer 10 and method generate two sequences of Lanczos vectors $v_1, v_2, \ldots, v_k$, and $w_1, w_2, \ldots, w_k$ which build bases, for each k=1, 2, ..., for the spaces spanned by the first k vectors of the block Krylov sequences:

$$R, AR, A^2R, \ldots \text{ and } L, A^TL, (A^T)^2L, \ldots \quad (19)$$

respectively. The generated k vectors are biorthogonal, i.e.

$$w_i^T v_j = \begin{cases} \delta_j & \text{if } i=j, \\ 0 & \text{if } i \neq j \end{cases} \quad (20)$$

for all i, j=1, ..., k.

Setting $V_k := [v_1 \, v_2 \, \ldots \, v_k]$ and $W_k := [w_1 \, w_2 \, \ldots \, w_k]$, the matrices $V_m$ and $V_p$ are obtained by biorthogonalizing the initial block R and L by a modified Gram-Schmidt type process. In particular, $R = W_m \rho$ and $L = W_p \eta$, where $\rho = [\rho_{ij}]_{i,j=1,2,\ldots m}$ and $\eta = [\eta_{i,j}]_{i,j=1,2,\ldots p}$ are upper triangular matrices. The vectors $v_1, v_2, \ldots, v_k$, and $w_1, w_2, \ldots, w_k$ may be generated by (m+p+1) term recurrences which may be written in a matrix formulation with the circuit characteristic matrix A:

$$AV_k = V_k T_k + [0 \ldots 0 \hat{v}_{k+1} \hat{v}_{k+1} \ldots \hat{v}_{k+m}]$$

$$A^T W_k = W_k \tilde{T}_k + [0 \ldots 0 \hat{w}_{k+1} \hat{w}_{k+1} \ldots \hat{w}_{k+p}] \quad (21)$$

The matrices $T_k = [t_{ij}]_{i,j=1,2,\ldots k}$ and $\tilde{T}_k = [\tilde{T}_{ij}]_{i,j=1,2,\ldots k}$ are banded matrices, where $T_k$ has m subdiagonals and p superdiagonals, and $\tilde{T}_k$ has p subdiagonals and m superdiagonals. These matrices $T_k$ and $\tilde{T}_k$ are transposes of each other, up to a diagonal scaling; i.e.

$$\tilde{T}_q^T = D_q T_q D_q^{-1} \quad (22)$$

where $$D_k = W_k^T V_k = \text{diag}(\delta_1, \delta_2, \ldots, \delta_k). \quad (23)$$

The vectors $$\hat{v}_{k+1}, \hat{v}_{k+2}, \ldots, \hat{v}_{k+m} \text{ and } \hat{w}_{k+1}, \hat{w}_{k+2}, \ldots, \hat{w}_{k+p} \quad (24)$$

in Equation (21) are auxiliary vectors. In a $k^{TH}$ step in the block MPVL method, described below, new vectors $v_k$ and $w_k$ and a new pair of auxiliary vectors $\hat{v}_{k+m}$ and $\hat{w}_{k+m}$ are determined. The remaining auxiliary vectors $$\hat{v}_{k+1}, \hat{v}_{k+2}, \ldots, \hat{v}_{k+m-1} \text{ and } \hat{w}_{k+1}, \hat{w}_{k+2}, \ldots, \hat{w}_{k+m-1} \quad (25)$$

are also updated.

Referring to FIG. 3, step 42 is performed by setting $\hat{v}_i = r_i$ for i=1, 2, ..., m, and setting $\hat{w}_j = l_j$ for j=1, 2, ..., p.

The following steps (1)–(5), corresponding to steps 44–58 in FIG. 3, are then iteratively performed for each step k=1, 2, ..., $k_{max}$:

(1) determine $t_{k,k-m} = \|\hat{v}_k\|_2$, and $\tilde{t}_{k,k-p} = \|\hat{w}_k\|_2$, and continue to steps (2)–(5) below if both $t_{k,k-m}$ and $\tilde{t}_{k,k-p}$ are non-zero, or, alternatively, not smaller than a predetermined computational limit. Otherwise, if either $t_{k,k-m}=0$ or $\tilde{t}_{k,k-p}=0$, then the method stops and does not perform steps (2)–(5) below.

(2) determine $v_k$ and $w_k$ by setting:

$$v_k = \frac{\hat{v}_k}{t_{k,k-m}}, \; w_k = \frac{\hat{w}_k}{\tilde{t}_{k,k-p}}, \; \delta_k = w_k^T v_k \quad (26)$$

then if k≤m, set $\rho_{kk} = t_{k,k-m}$, and if k≤p, set $\eta_{kk} = \tilde{t}_{k,k-p}$.

(3) determine $\hat{v}_{k+m}$ and $\hat{w}_{k+p}$ by setting $i_m = \max\{1, k-m\}$ and $i_p = \max\{1, k-p\}$, and setting $v = Av_k$ and $w = A^T w_k$. Then, for $i = i_p, i_{p+1}, \ldots, k$, set $$t_{ik} = \frac{w_i^T v}{\delta_i} \text{ and } v = v - v_i t_{ik} \quad (27)$$

For $i = i_m, i_{m+1}, \ldots, k$, set $$\tilde{t}_{ik} = \frac{v_i^T w}{\delta_i} \text{ and } w = w - w_i \tilde{t}_{ik} \quad (28)$$

and then set $\hat{v}_{k+m} = v$ and $\hat{w}_{k+p} = w$.

(4) update $\hat{v}_{k+i}$ for 1≤i<m, where, for i=1, 2, ..., m−1, if k+i≤m, set $$\rho_{k,k+i} = \frac{w_k^T \hat{v}_{k+i}}{\delta_k} \text{ and } \hat{v}_{k+i} = \hat{v}_{k+i} - v_k \rho_{k,k+i} \quad (29)$$

and if k+i>m, set $$t_{k,k-m+i} = \frac{\tilde{t}_{k-m+i,k} \delta_{k-m+i}}{\delta_k} \text{ and } \hat{v}_{k+i} = \hat{v}_{k+i} - v_k t_{k,k-m+i} \quad (30)$$

(5) update $\hat{w}_{k+i}$ for 1≤i<p, where, for i=1, 2, ..., p−1, if k+i≤p, set $$\eta_{k,k+i} = \frac{v_k^T \hat{w}_{k+i}}{\delta_k} \text{ and } \hat{w}_{k+i} = \hat{w}_{k+i} - w_k \eta_{k,k+i} \quad (31)$$

and if k+i>p, set $$\tilde{t}_{k,k-p+i} = \frac{t_{k-p+i,k} \delta_{k-p+i}}{\delta_k} \text{ and } \hat{w}_{k+i} = \hat{w}_{k+i} - w_k \tilde{t}_{k,k-p+i} \quad (32)$$

One skilled in the art would understand that a look-ahead method, such as described in U.S. application Ser. No. 08/269,230, incorporated above, may be applied to steps (3)–(5) above to avoid numerical instabilities or breakdowns with $\delta_k$ near or equal to zero.

The Laplace-domain transfer function of the linear subnetwork is described by Equation (10), where the general H(s) is a p×m matrix valued transfer function. The circuit analyzer 10 and method use the block Lanczos method described in steps (1)–(5) above to generate the reduced-order approximation to H(s). The matrix transfer function may be expanded in an infinite Taylor series:

$$H(s_0 + \sigma) = L^T(I - A\sigma)^{-1}R = \sum_{j=0}^{\infty} L^T A^j R \sigma^j \quad (33)$$

where $M_j = L^T A^j R$, the coefficients of $\sigma_j$ for $j = 0, 1, \ldots$, represent the moments of the circuit response. Using the first relation in Equation (21) and that $T_k$ is a banded matrix, then $$A^j R = V_k T_k^j \begin{bmatrix} \rho \\ 0 \end{bmatrix} \quad (34)$$

for $j = 0, 1, \ldots, q'-1$, where $q' = \lfloor k/m \rfloor$, with $\lfloor \cdot \rfloor$ as the greatest integer function. From the second relation in Equation (21), then $$(A^T)^j L = W_k \tilde{T}_k^j \begin{bmatrix} \eta \\ 0 \end{bmatrix} \quad (35)$$

for $j = 0, 1, \ldots, q''-1$, where $q'' = \lfloor k/p \rfloor$.

By Equation (33), each moment $M_j$ may be written as:

$$M_j = L^T A^j R = (L^T A^{j'})(A^{j''} R) \quad (36)$$

where $j = j' + j''$. If $j \leq q' + q'' - 2$, then $j'$ and $j''$ may be found such that $0 \leq j' \leq q'-1$ and $0 \leq j'' \leq q''-1$. From Equations (32)–(34), $$M_j = [\eta^T 0](\tilde{T}_k^{j'})^T W_k^T V_k T_k^{j''} \begin{bmatrix} \rho \\ 0 \end{bmatrix} \quad (37)$$

for $j = 0, 1, \ldots, q'+q''-2$. Since $W_k^T V_k = D_k$ and $\tilde{T}_k^T = D_k T_k D_k^{-1}$, $$(\tilde{T}_k^{j'})^T = D_k T_k^{j'} D_k^{-1} \quad (38)$$

so from Equation (36), $$M_j = [\eta^T 0] D_k T_k^j \begin{bmatrix} \rho \\ 0 \end{bmatrix} \quad (39)$$

for $j = 0, 1, \ldots, q'+q''-2$.

Equation (39) is also satisfied for $j = q'+q''-1$, so q may be set equal to $q = q'+q'' = \lfloor k/m \rfloor + \lfloor k/p \rfloor$. From Equation (39), the expression $$[\eta^T 0] D_k (I - \sigma T_k)^{-1} \begin{bmatrix} \rho \\ 0 \end{bmatrix} = \sum_{j=0}^{\infty} [\eta^T 0] D_k T_k^j \begin{bmatrix} \rho \\ 0 \end{bmatrix} \sigma^k \quad (40)$$

$$= \sum_{j=0}^{q-1} M_j \sigma^j + O(\sigma^q)$$

has the same first q matrix Taylor coefficients as $H(s_0 + \sigma)$, so $$H_k(s_0 + \sigma) = [\eta^T 0] D_k (I - \sigma T_k)^{-1} \begin{bmatrix} \rho \\ 0 \end{bmatrix} \quad (41)$$

is a matrix Padé approximant of $H(s_0 + \sigma)$.

For a time-domain reduced-order model of a multiple-input multiple-output linear subnetwork, Equation (12) has y and u as vectors, while a single-input, single-output linear subnetwork may have vectors y and u reduced to scalars. From the properties of the block Lanczos method, $W_k^T A V_k = DT_k$, and, by the biorthogonality of the Lanczos vectors, $W_k^T V_k = D$. From the properties of the Lanczos vectors, as described above, $$R = V_k \begin{bmatrix} \rho \\ 0 \end{bmatrix} \text{ and } L = W_k \begin{bmatrix} \eta \\ 0 \end{bmatrix} \quad (42)$$

so by applying Equation (42) to Equation (13), the time-domain reduced-order model of the linear subnetwork is:

$$-T_k \frac{d}{dt} d + (I + s_0 T_k) d = D_k \begin{bmatrix} \rho \\ 0 \end{bmatrix} u \quad (43)$$

$$y = [\eta^T 0] D_k d$$

where the transfer function corresponding to Equation (43) represents a matrix Padé approximant of the original linear subnetwork transfer function.

By using the disclosed MPVL method, Equation (43) may be used to replace a greater number of equations as in Equation (6) modelling the linear portion of the circuit being analyzed.

Figure 4:
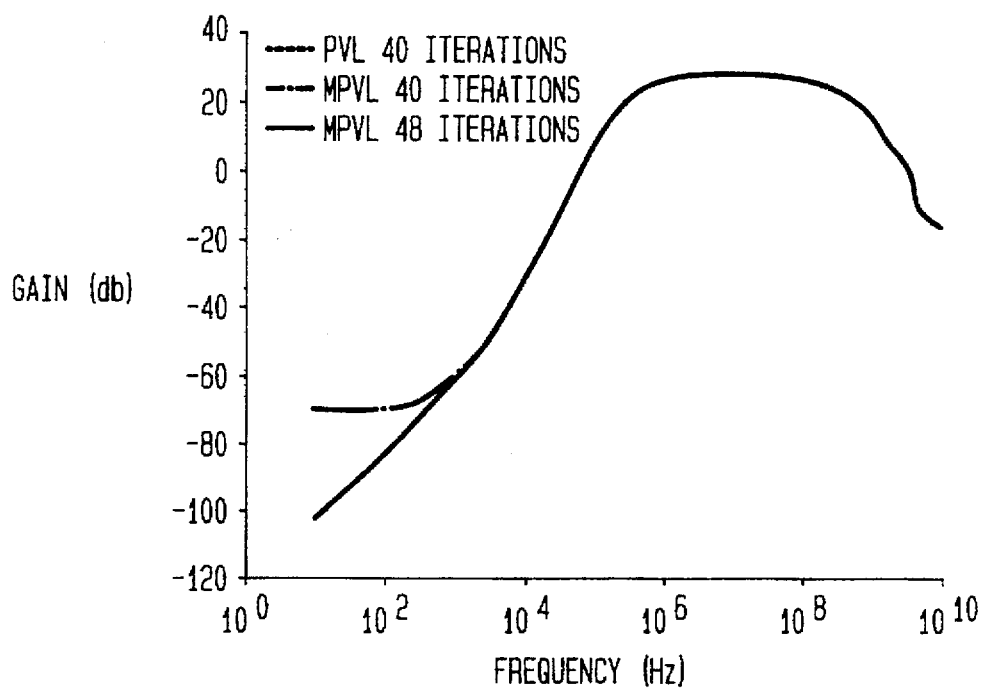
FIGS. 4–6 illustrate graphs of frequency responses by MPVL and Padé via Lanczos (PVL) analysis.
Figure 5:
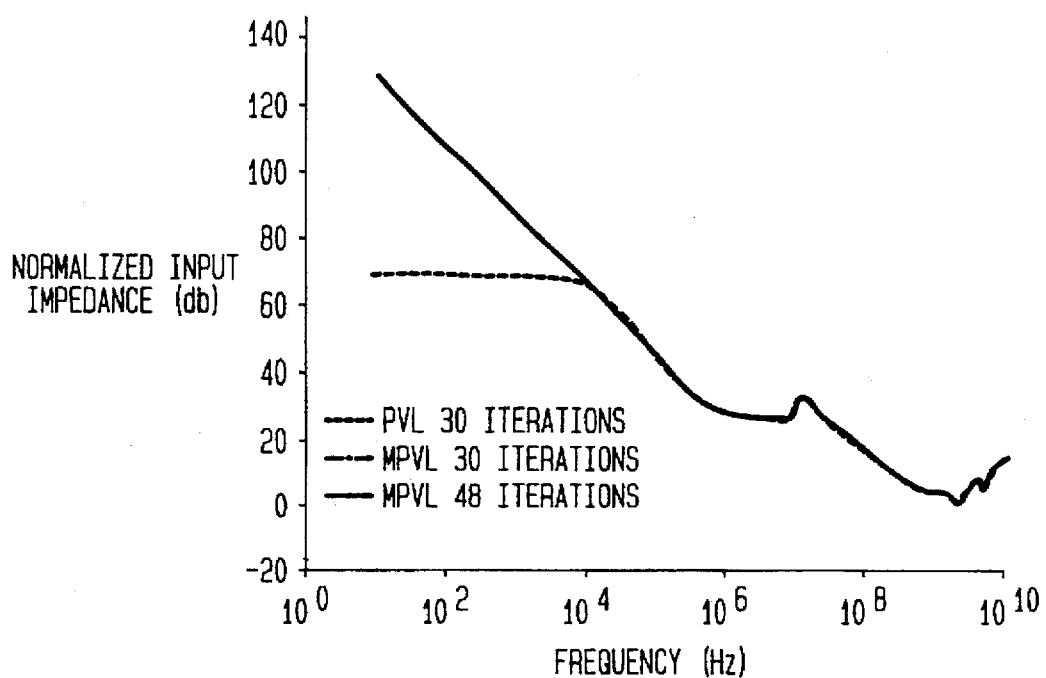
Figure 6:
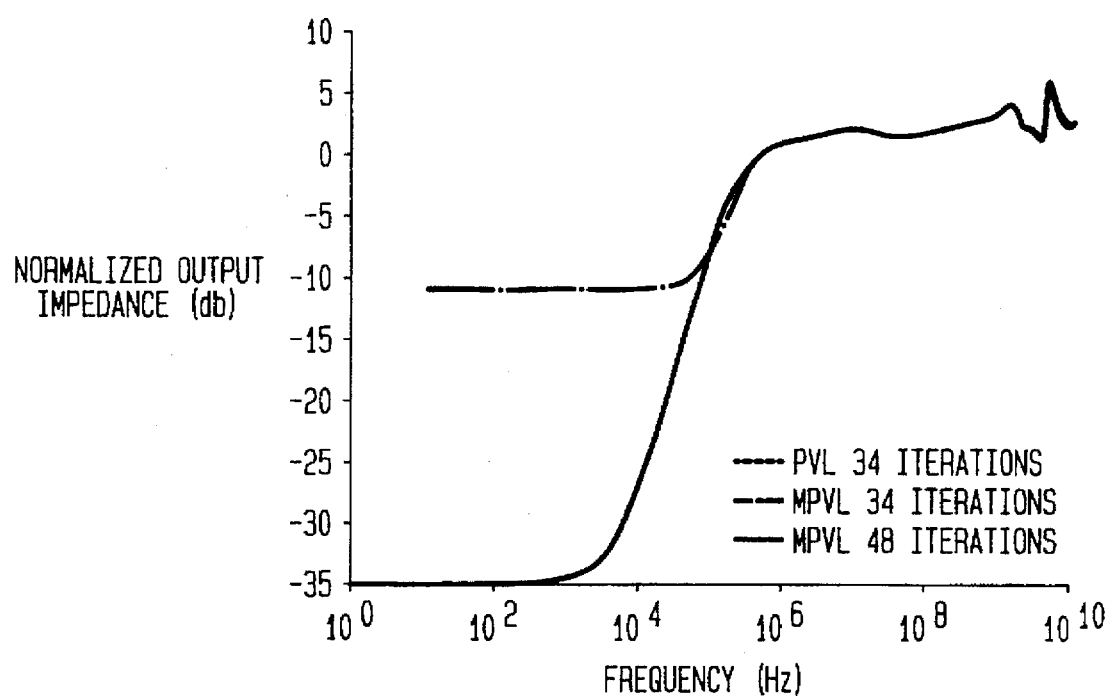

FIGS. 4–6 illustrate examples of the performance of the disclosed circuit analyzer 10 and method using MPVL for modeling a low-noise amplifier designed for a radio frequency application to be implemented using advanced BiCMOS. A netlist of the low-noise amplifier, extracted from the actual layout with all parasitics included, includes 51 MOSFET devices, 26 bipolar transistors, 35 resistors, 6 inductors, and 381 capacitors. The size of linearized circuit matrices corresponding to this netlist is 414. The example low-noise amplifier is a two-port system, and so may be considered to have two independent inputs and outputs, and may be fully characterized by a 2×2 matrix-valued transfer function having three independent entries. The disclosed circuit analyzer 10 and method using MPVL generated a reduced-order model of the transfer function matrix which converged after about 48 iterations, which corresponds to 2×24 matched matrix moments. FIGS. 4–6 plot the magnitudes of gain, normalized input impedance, and normalized output impedance of the low-noise amplifier.

It is to be noted that the graphs illustrating the performance of MPVL in 48 iterations is substantially indistinguishable, within a computational limit, from the actual frequency response of the low-noise amplifier. The disclosed circuit analyzer 10 and method using MPVL generates the approximation of the gain, normalized input impedance, and normalized output impedance simultaneously, while other methods may generate each approximation of the gain, normalized input impedance, and normalized output impedance individually. Accordingly, the disclosed circuit analyzer 10 and method using MPVL generally performs with a lesser number of iterations and state variables of the reduced-order model of the low-noise amplifier circuit being analyzed.

While the disclosed circuit analyzer and method has been particularly shown and described with reference to the preferred embodiments, it will be understood by those skilled in the art that various modifications in form and detail may be made therein without departing from the scope and spirit of the invention. For example, that different functional blocks may be used to implement the exemplary components shown in FIG. 1 of the disclosed circuit analyzer 10, and/or such functional blocks may be implemented on an integrated circuit having, for example, a processor and memory. It is to be understood that the disclosed circuit analyzer 10 and method, in whole or in part, may be implemented as hardware running software, as firmware, or as discrete circuits and/or hardwiring.

It is also to be understood that the disclosed method may be applied to analyzing circuits as well as different environments; for example, having an associated transfer function. In other embodiments, the disclosed method may be implemented using different transformation processes, such as other matrix manipulation techniques for implementing the disclosed circuit analyzer 10 and method. Accordingly, modifications such as those suggested above, but not limited thereto, are to be considered within the scope of the invention.

What is claimed is:

1. An apparatus comprising:
   a processing unit having:
      a memory for storing circuit characteristic data representing a circuit;
      a program for generating matrix transfer function data relating to a matrix transfer function associated with the circuit characteristic data;
      a processor for executing the program; and
      means for generating the frequency response signal in response to the matrix transfer function data.

2. The apparatus of claim 1 wherein the means for generating the frequency response signal uses the matrix transfer function data to generate the frequency response signal according to an frequency response transfer function $$H_k(s_0 + \sigma) = [\eta^T 0] D_k (I - \sigma T_k)^{-1} \begin{bmatrix} \rho \\ 0 \end{bmatrix}$$

where $T_k$ is a banded matrix, $s_0$ is a frequency shift, I is an identity matrix, $\rho$ and $\eta$ are upper triangular matrices, and $D_k$, $\rho$ and $\eta$ are obtained from the circuit characteristic data.

3. The apparatus of claim 1 wherein the processor, responsive to execution of the program, calculates characteristic matrix data representing parameters associated with a characteristic matrix of the circuit characteristic data, and determines the matrix Padé approximant from the characteristic matrix data.

4. The apparatus of claim 3 wherein the processor, responsive to execution of the program, processes the matrix characteristic data to reduce the characteristic matrix and to determine the matrix Padé approximant therefrom.

5. The apparatus of claim 4 wherein the processor, executing the program, processes the characteristic matrix data using a Lanczos procedure.

6. The apparatus of claim 5 wherein the processor, executing the program, iteratively processes the characteristic data to iteratively reduce the characteristic matrix using a look-ahead determination in the Lanczos procedure.

7. An apparatus for generating a frequency response signal indicative of an frequency response of a circuit, the apparatus comprising:
   a data source providing circuit characteristic data representing the circuit; and
   a processing unit having:
      a memory for receiving and storing the circuit characteristic data from the data source;
      a set of at least one program including a Matrix Padé Via Lanczos (MPVL) program for generating a matrix Padé approximant of a transfer function relating to a matrix transfer function associated with the circuit characteristic data;
      a processor for executing the MPVL program; and
      means for generating the frequency response signal in response to the matrix Padé approximant.

8. The apparatus of claim 7 wherein the processor, executing the MPVL program, calculates characteristic matrix data representing parameters associated with a characteristic matrix of the circuit characteristic data, and determines the matrix Padé approximant from the characteristic matrix data by a block Lanczos procedure.

9. The apparatus of claim 8 wherein the processor, executing the MPVL program, processes the matrix characteristic data to reduce the characteristic matrix using a plurality of Lanczos vectors and to determine the matrix Padé approximant therefrom.

10. The apparatus of claim 9 wherein the processor, executing the MPVL program, processes the characteristic matrix data using the block Lanczos procedure on the plurality of Lanczos vectors.

11. The apparatus of claim 10 wherein the processor, executing the MPVL program, iteratively processes the characteristic data and the plurality of Lanczos vectors to iteratively reduce the characteristic matrix using a look-ahead determination in the block Lanczos procedure.

12. A circuit analyzer for generating a graphic representation of a predicted performance of a circuit, the circuit analyzer comprising:
   an input device for inputting a plurality of circuit parameters representing the circuit;
   memory and stored programs for receiving and storing the circuit parameters;
   a processor operating with the stored programs and including:
      means for processing the circuit parameters;
      means for performing a block Lanczos procedure on the processed parameters;
      means for calculating a matrix Padé approximant of a transfer function of the circuit; and
      means for generating the graphic representation from the matrix Padé approximant to predict the performance of the circuit; and
   a display for displaying the graphic representation.

13. The circuit analyzer of claim 12 wherein the Lanczos procedure performing means performs the block Lanczos procedure with a look-ahead determination using matrix data representing a non-singular matrix.

14. The circuit analyzer of claim 13 wherein the block Lanczos procedure performing means iteratively generates a plurality of intermediate parameters from the processed circuit parameters and stores the generated intermediate parameters in the memory.

15. The circuit analyzer of claim 14 wherein the intermediate parameters of a $k^{TH}$ iteration includes matrix data representing a non-singular matrix, the inverse thereof used by the block Lanczos procedure performing means to generate an $(k+1)^{TH}$ iteration of intermediate parameters.

16. The circuit analyzer of claim 15 wherein the Lanczos procedure performing means generates banded matrix data representing a banded matrix $T_k$ from the stored intermediate parameters.

17. A method for generating a frequency response signal of a circuit, the method comprising the steps of:
   providing circuit characteristic data associated with the circuit;
   providing characteristic matrix data associated with the circuit characteristic data and representing parameters associated with a characteristic matrix;
   executing a program using a processing unit to generate matrix transfer function data relating to a matrix transfer function associated with the characteristic matrix data; and
   generating the frequency response signal in response to the matrix transfer function data.

18. The method of claim 17 wherein the step of generating the frequency response signal includes the step of determining an frequency response transfer function $$H_k(s_0 + \sigma) = [\eta^T\, 0] D_k (I - \sigma T_k)^{-1} \begin{bmatrix} \rho \\ 0 \end{bmatrix}$$

where $T_k$ is a banded matrix, $s_0$ is a frequency shift, $I$ is an identity matrix, $\rho$ and $\eta$ are upper triangular matrices, and $D_k$, $\rho$ and $\eta$ are obtained from the circuit characteristic data.

19. A method for analyzing a circuit to predict performance of a circuit, comprising the steps of:

receiving a plurality of circuit parameters representing the circuit from an input device;

storing the received circuit parameters in memory;

processing the circuit parameters to generate characteristic matrix data representing parameters associated with a characteristic matrix;

performing a block Lanczos procedure on the processed parameters to generate a plurality of Lanczos vectors;

calculating a matrix Padé approximant of a transfer function of the circuit from the plurality of Lanczos vectors;

generating a graphic representation from the matrix Padé approximant to predict the performance of the circuit; and displaying the graphic representation on a display.

20. The method of claim 19 wherein the step of performing the block Lanczos procedure includes the step of performing a look-ahead determination using matrix data representing a non-singular matrix.

21. The method of claim 19 wherein the step of performing the block Lanczos procedure includes the steps of:

iteratively generating a plurality of intermediate parameters from the processed parameters; and storing the generated intermediate parameters in the memory.

22. The method of claim 21 wherein the step of performing the block Lanczos procedure includes the step of generating matrix data representing a matrix transfer function from the stored intermediate parameters.

* * * * *